(12) United States Patent
Yoshida et al.

(10) Patent No.: US 7,459,349 B1
(45) Date of Patent: Dec. 2, 2008

(54) METHOD OF FORMING A STACK OF SEMICONDUCTOR PACKAGES

(75) Inventors: Akito Yoshida, Chandler, AZ (US); Young Wook Heo, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 322 days.

(21) Appl. No.: 11/254,339

(22) Filed: Oct. 19, 2005

Related U.S. Application Data

(63) Continuation of application No. 10/883,593, filed on Jun. 30, 2004, now Pat. No. 6,987,314.

(60) Provisional application No. 60/578,240, filed on Jun. 8, 2004.

(51) Int. Cl.
*H01L 21/00* (2006.01)

(52) U.S. Cl. .................. 438/126; 438/109; 438/127; 257/E21.502; 257/E21.506

(58) Field of Classification Search .................. 438/126
See application file for complete search history.

(56) References Cited

OTHER PUBLICATIONS

Akito Yoshida et al., "Design and Stacking of An Extremely Thin Chip-Scale Package", *Electronic Components and Technology Conference*, May 27-30, 2003, IEEE pp. 1095-1100.

*Primary Examiner*—David A Zameke
(74) *Attorney, Agent, or Firm*—Gunnison, McKay & Hodgson, L.L.P.; Serge J. Hodgson

(57) ABSTRACT

A stackable semiconductor package includes a substrate with a first side surface that includes circuit patterns. Each circuit pattern includes a pad. A semiconductor die is electrically coupled to the circuit patterns. An encapsulant covers the semiconductor die and the first side surface of the substrate inward of the pads. A layer of a solder is fused to each of the pads. A lateral distance between immediately adjacent pads is selected to be greater than a lateral distance between sidewalls of the encapsulant and immediately adjacent pads, and a height of the solder layers relative to the first side surface is selected to be less than a height of the sidewalls of the encapsulant, so that misalignment of a semiconductor package stacked on the solder layers/pads is self-correcting when juxtaposed ones of the solder layers and respective solder balls of the second semiconductor package are reflowed and fused together.

20 Claims, 12 Drawing Sheets

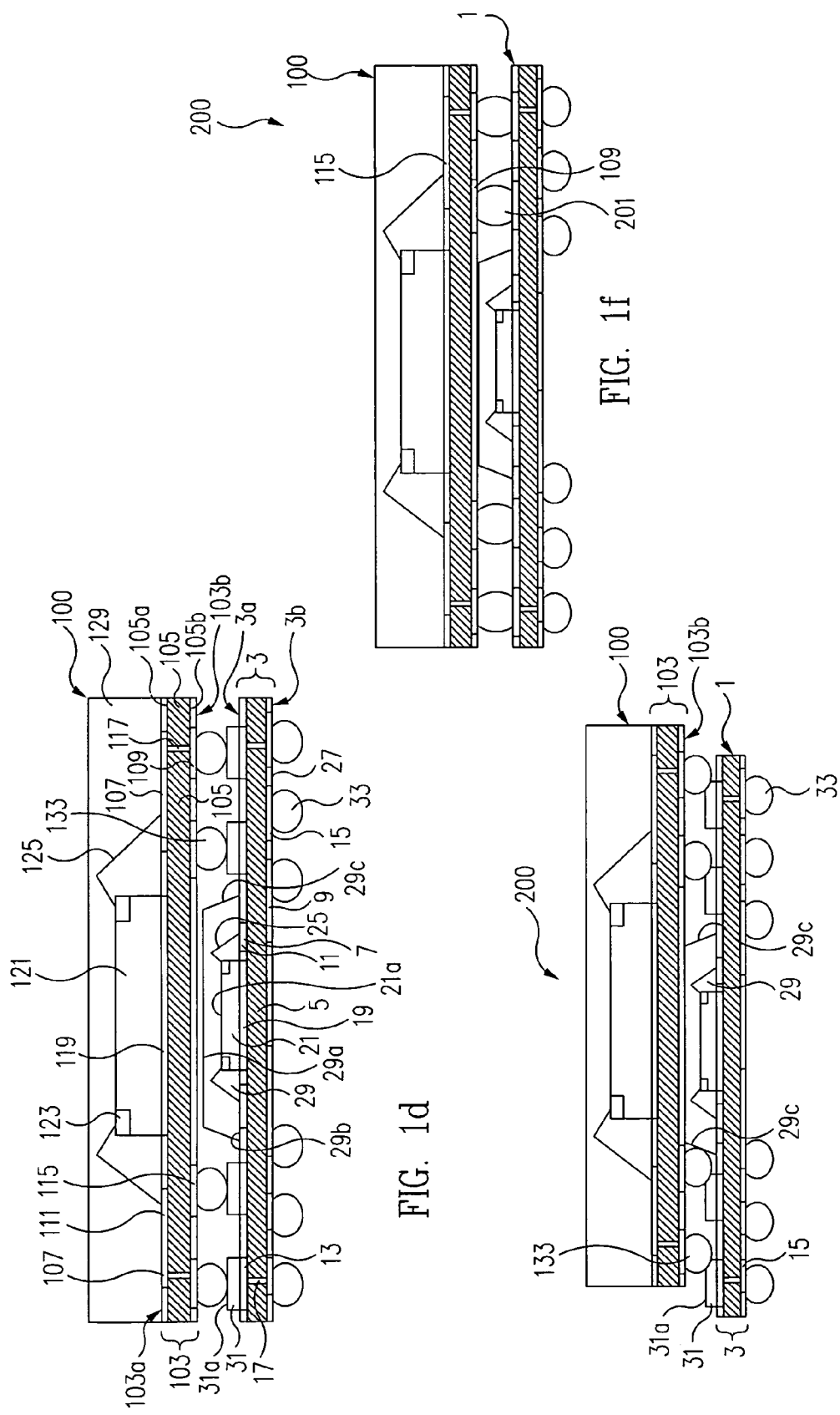

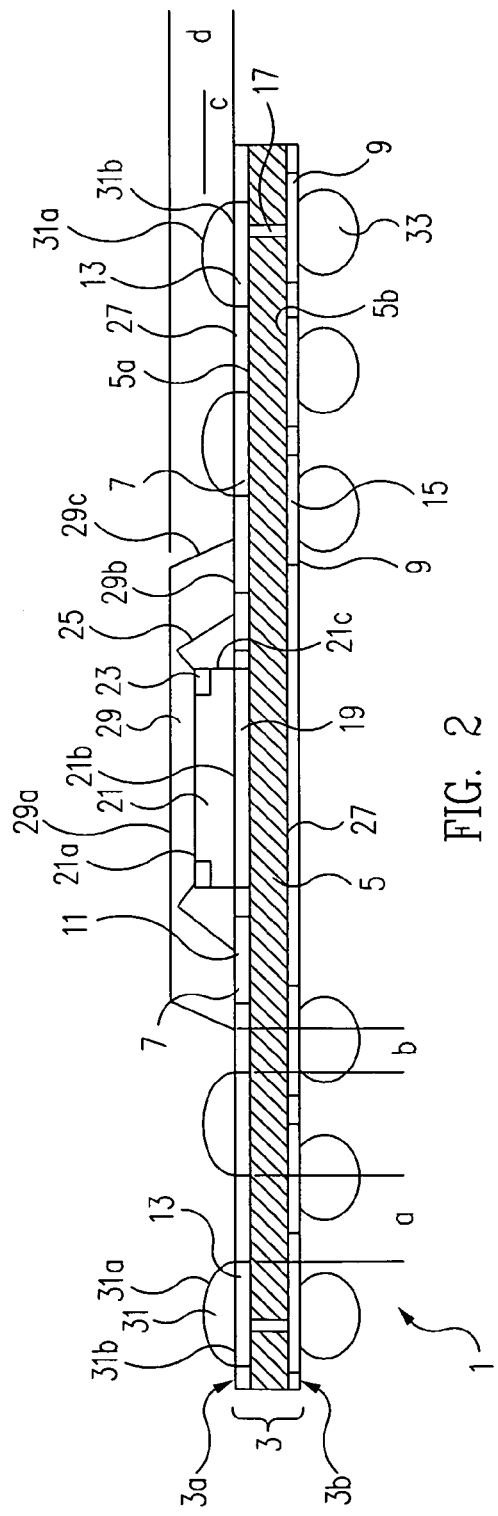
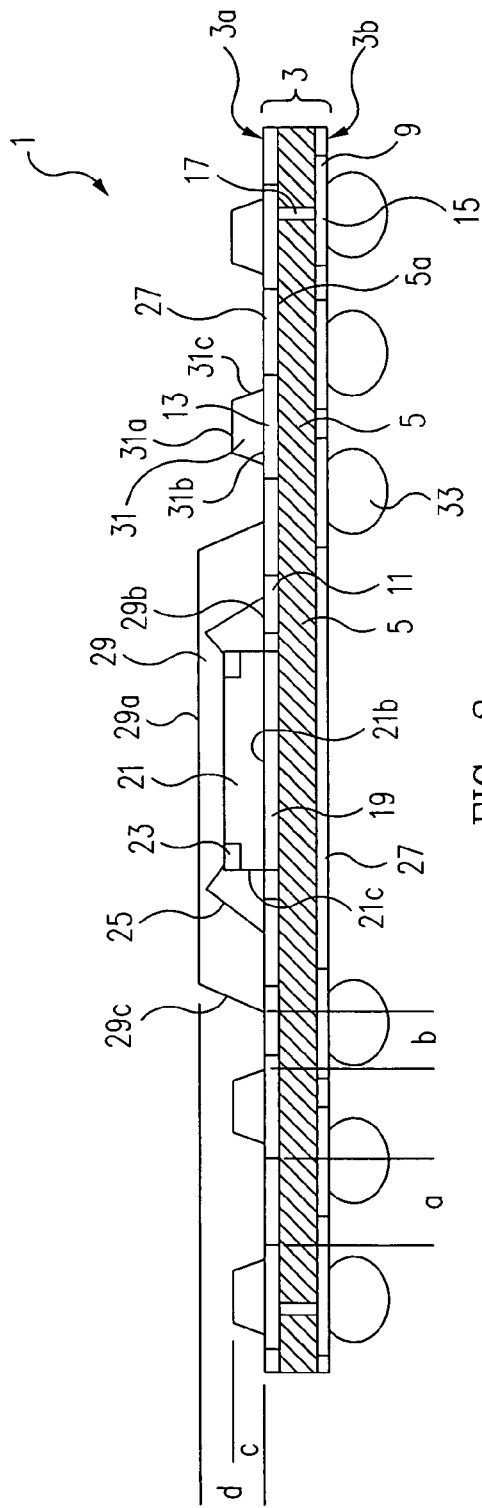
FIG. 2
FIG. 3

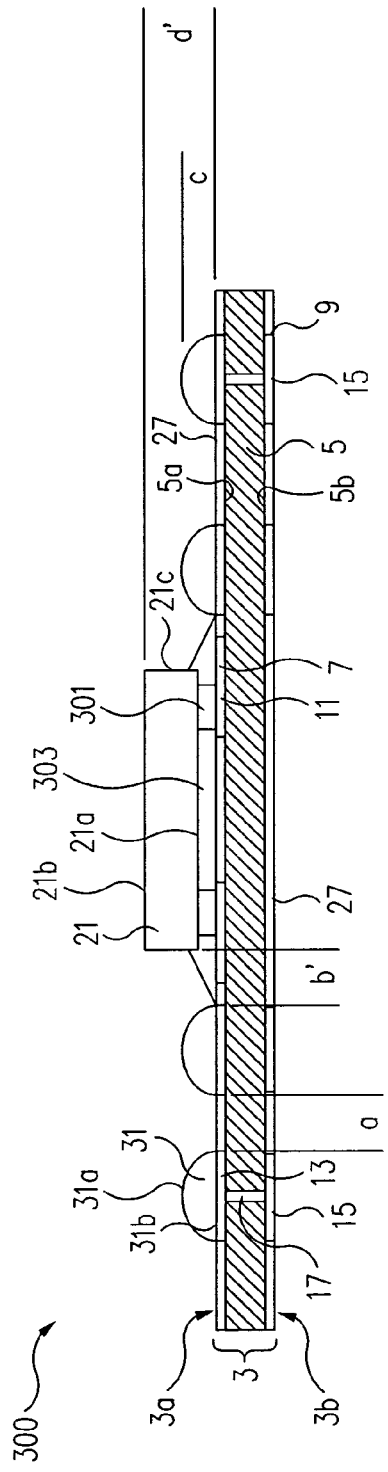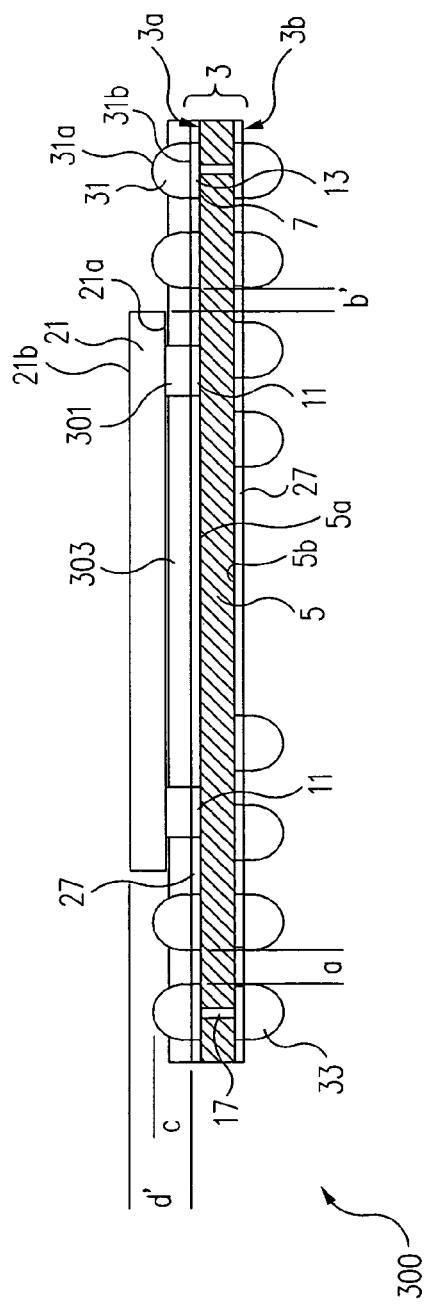
FIG. 4a
FIG. 4b

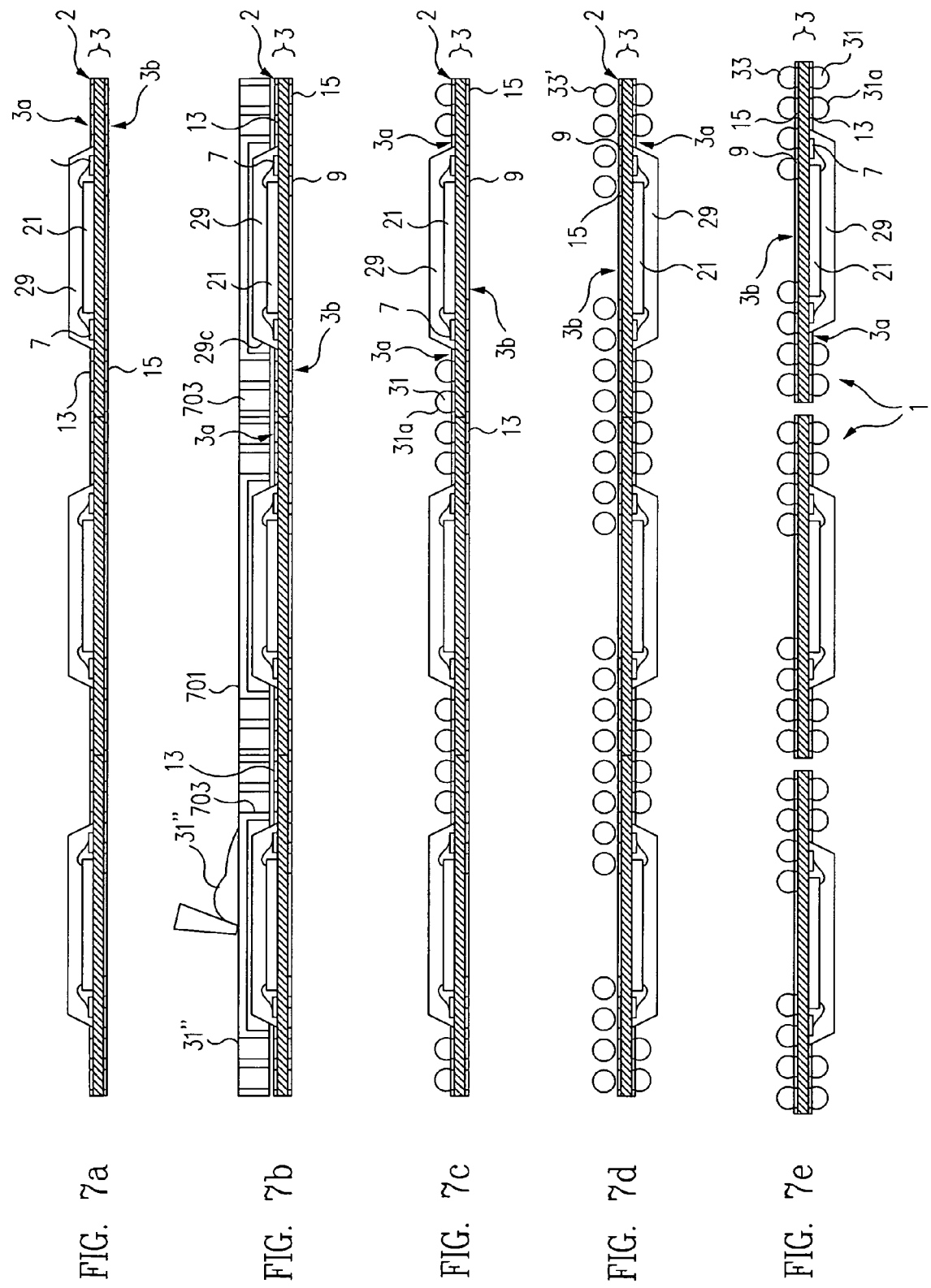

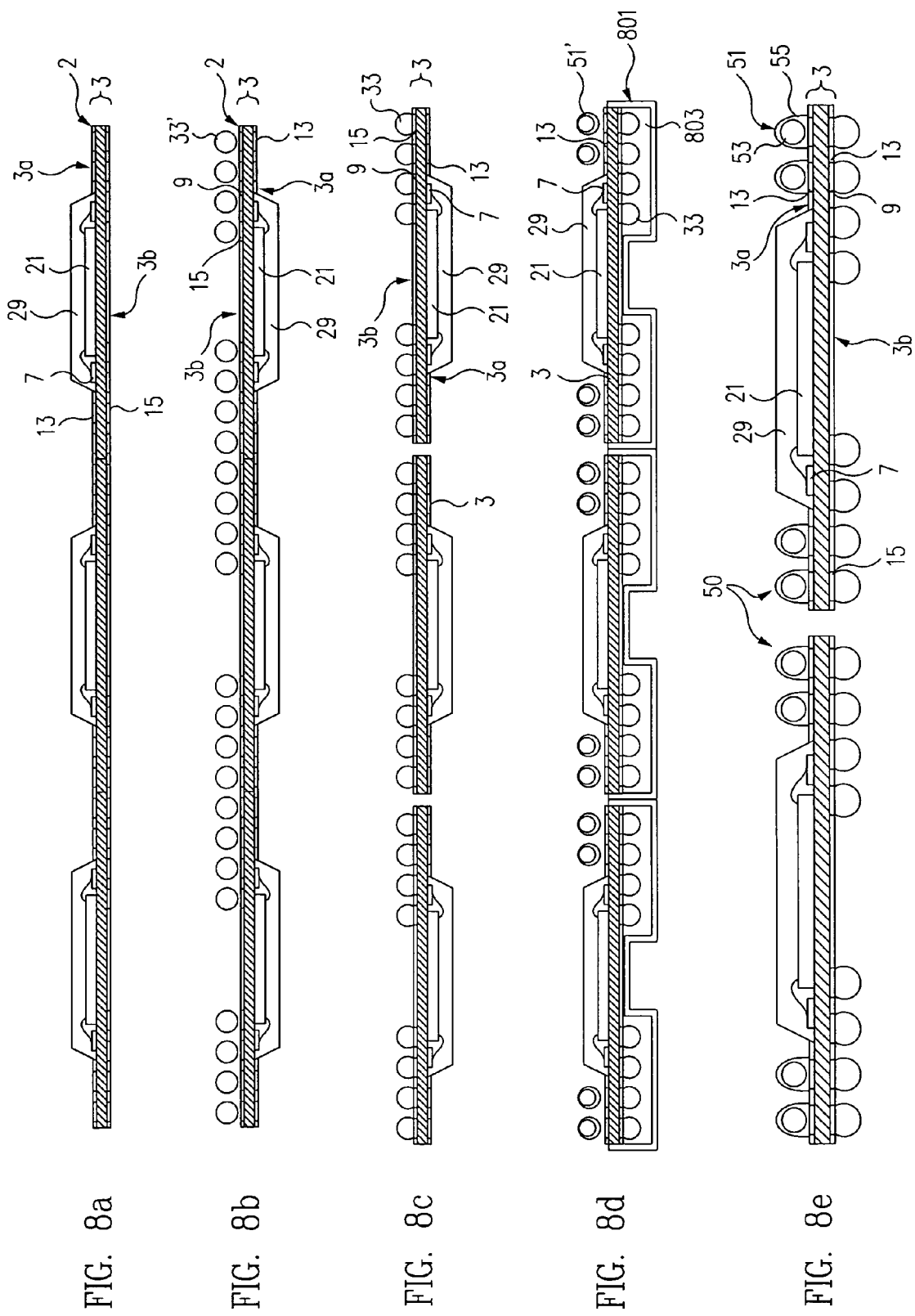

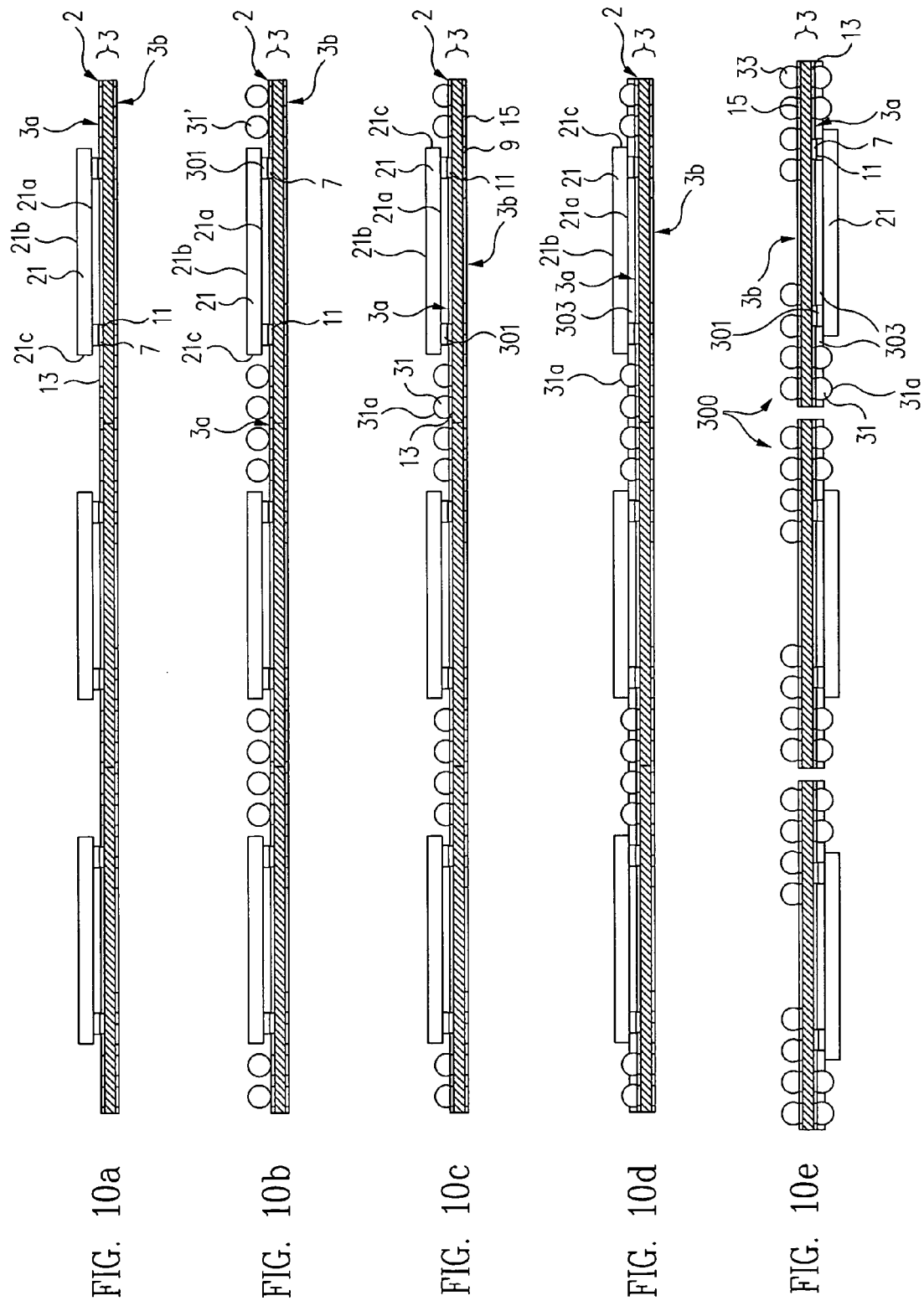

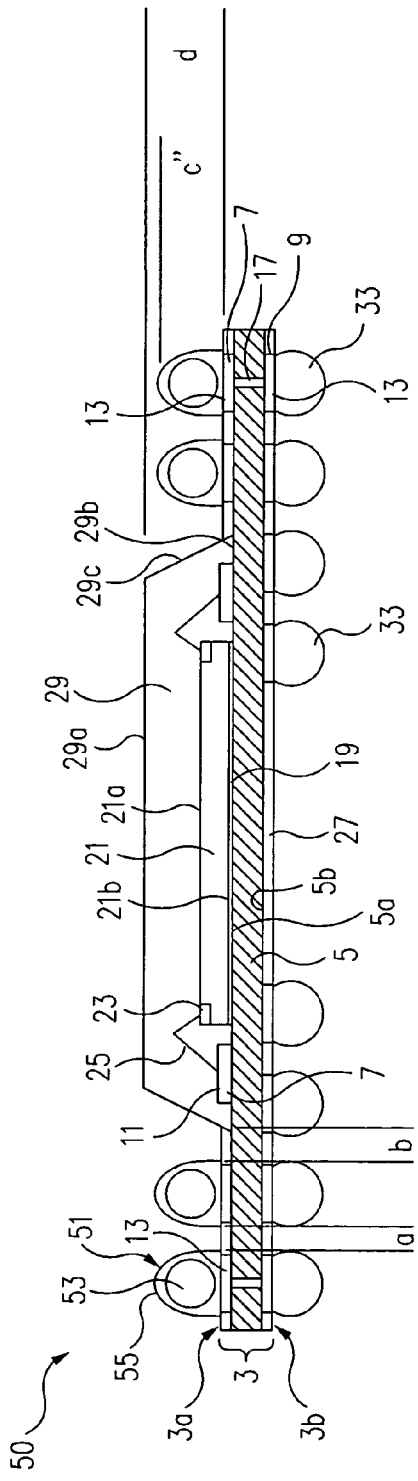
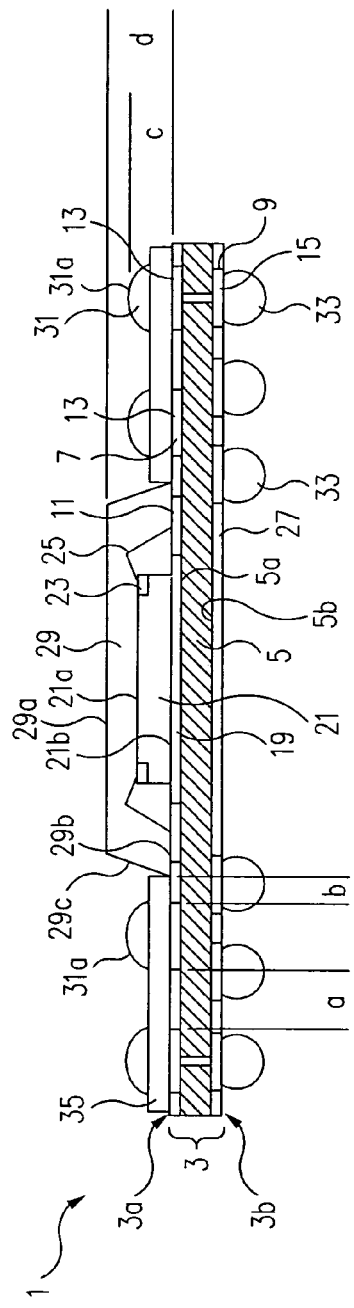
FIG. 11
FIG. 12

METHOD OF FORMING A STACK OF SEMICONDUCTOR PACKAGES

CROSS-REFERENCE TO RELATED APPLICATION

This application is a continuation of U.S. patent application Ser. No. 10/883,593, filed on Jun. 30, 2004, which claims priority to U.S. Provisional Patent Application Ser. No. 60/578,240, entitled "Stackable Package With Solder On Pads On Which Second Package Is Stacked," which was filed on Jun. 8, 2004 by the present inventors, and which are both incorporated herein by reference in their entirety.

BACKGROUND OF THE INVENTION

1. Field of the Invention

The present invention is in the field of semiconductor die packaging.

2. Description of the Related Art

Many types of electronic devices that include packaged integrated circuits (i.e., semiconductor dies), such as portable telephones, personal computers, and digital cameras, are being developed with increased functionality. To meet this trend, companies that assemble semiconductor dies into packages are developing semiconductor packages that are stackable. A stackable semiconductor package has the capability of having a second semiconductor package stacked upon it. Typically, solder balls of the second semiconductor package are fused to circuit pattern pads of the first semiconductor package, so as to be in electrical communication with the semiconductor die of the first semiconductor package and/or the input/output terminals of the first semiconductor package.

There are several difficulties associated with such stackable packages. For instance, the size of the solder balls of the second semiconductor package must large enough so that the second semiconductor package sufficiently clears a cap of plastic encapsulant on the first semiconductor package. On the other hand, the solder balls of the second semiconductor package cannot be too close together, i.e., cannot have too fine a pitch, or else the solder balls of the second semiconductor package may contact each other, forming an electrical short circuit. These constraints on the solder balls of the second semiconductor package limit the types of semiconductor packages that can be stacked and electrically coupled in the manner described above. Another problem with such stacked semiconductor packages arises during the stacking process. During stacking, the second semiconductor package may be misaligned such that its solder balls do not squarely rest on the pads of the underlying first semiconductor package. As a result, electrical failures of the stacked packages can occur.

SUMMARY OF THE INVENTION

The present invention includes electronic assemblies, stackable semiconductor packages, methods of making such assemblies and packages, and methods of stacking semiconductor packages onto such assemblies and packages, among other aspects. In some embodiments, the structures and methods allow a plurality of semiconductor packages to be stacked one on top of another, while minimizing the risks of electrical failures, such as short circuits and open circuit, that can occur due to misalignment during the stacking process.

An exemplary embodiment of the present invention includes an electronic assembly, which may be part of a semiconductor package, that includes a substrate with a first side surface that includes circuit patterns. Each circuit pattern includes a pad. A semiconductor die is electrically coupled to the circuit patterns using, for instance, bond wires. An encapsulant covers the semiconductor die and the first side surface of the substrate inward of the pads. A layer of a solder is fused to each of the pads. A lateral distance between immediately adjacent ones of the pads is selected to be greater than a lateral distance between respective sidewalls of the encapsulant and immediately adjacent pads. In addition, a height of the respective solder layers relative to the first side surface of the substrate is selected to be less than a height of the sidewalls of the encapsulant relative to the first side surface, so that misalignment of a semiconductor package stacked on the solder layers is self-correcting when juxtaposed ones of the solder layers and respective solder balls of the semiconductor package are reflowed and fused together.

In an alternative embodiment, the semiconductor die is electrically coupled to the circuit patterns in a flip chip connection, and the encapsulant is omitted. As above, a lateral distance between immediately adjacent ones of the pads is selected to be greater than a lateral distance between respective sidewalls of the encapsulant and immediately adjacent pads. Moreover, the height of the respective solder layers relative to the first side surface is selected to be less than a height of the sidewalls of the semiconductor die. As a result, the above-described self-correction of misalignment during the stacking process may be obtained.

The present invention may be best understood by reference to the following detailed description when read in conjunction with the accompanying drawings.

BRIEF DESCRIPTION OF THE DRAWINGS

FIGS. 1b and 1c are top plan views of alternative embodiments of the stackable semiconductor package of FIG. 1a.

FIGS. 1d, 1e, and 1f are cross-sectional side views of stages in a method of stacking a second semiconductor package onto the stackable semiconductor package of FIG. 1a.

FIG. 2 is a cross-sectional side view of an alternative stackable semiconductor package.

FIG. 3 is a cross-sectional side view of an alternative stackable semiconductor package.

FIGS. 4a and 4b are cross-sectional side views of alternative stackable semiconductor packages where the semiconductor die is electrically coupled to the substrate in a flip chip connection.

FIGS. 7a-7e are cross-sectional side views of stages in another alternative method of making the stackable semiconductor package of FIG. 2.

FIGS. 8a-8e are cross-sectional side views of stages in an alternative method of making the stackable semiconductor package of FIG. 11.

FIGS. 10a-10e are cross-sectional side views of stages in a method of making the stackable semiconductor package of FIG. 4b.

FIG. 11 is a cross-sectional side view of an alternative stackable semiconductor package.

FIG. 12 is a cross-sectional side view of an alternative stackable semiconductor package.

Common reference numerals are used throughout the drawings and the detailed description to indicate like elements.

DETAILED DESCRIPTION OF EXEMPLARY EMBODIMENTS

Figure 1A:
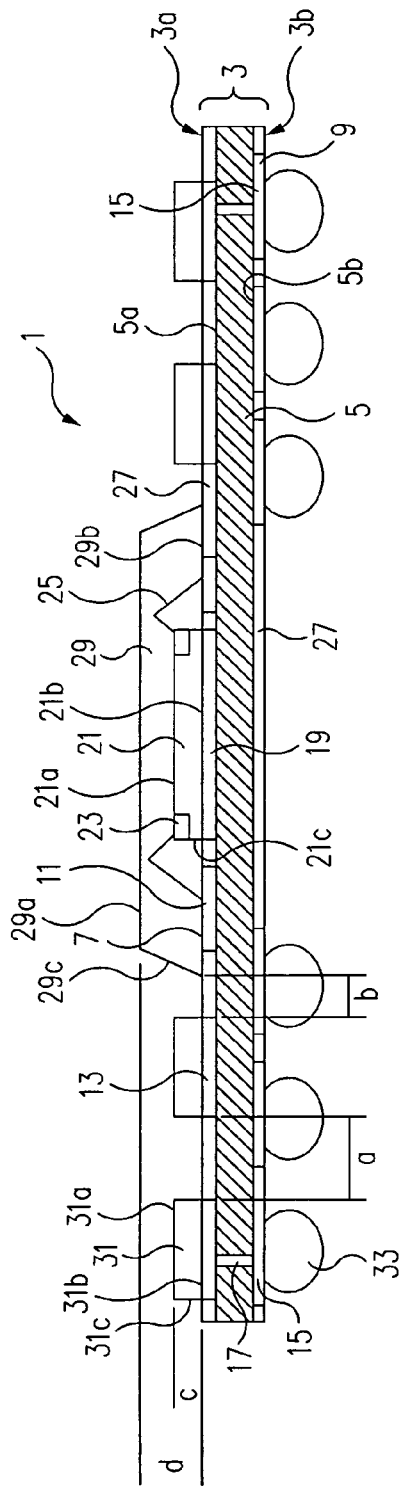
FIG. 1a is a cross-sectional side view of a stackable semiconductor package.

FIG. 1a is a cross-sectional side view of a first embodiment of a stackable semiconductor package in accordance with the present invention. Stackable semiconductor package 1 includes a substrate 3 that includes opposed first and second side surfaces 3a and 3b, respectively. As is described further below, the first side surface 3a includes circuit patterns 7, a die pad 19, and a layer of a protective cover coat 27. The second side surface 3a includes circuit patterns 9, and a layer of the protective cover coat 27.

Substrate 3 includes an insulative core layer 5 that includes an outer first surface 5a and an opposite outer second surface 5b. Insulative core layer 5 may be formed of an epoxy laminate or other conventional printed circuit board materials, and/or may be a layer (or layers) of other various resins, polyimide, or ceramic, among other possibilities.

Coupled to and overlying first surface 5a of core layer 5 is a plurality of electrically conductive circuit patterns 7. Some or all of the respective circuit patterns 7 may include an inner bond finger 11, and an outlying pad 13. Coupled to and overlying second surface 5b is a plurality of circuit patterns 9. Some or all of the circuit patterns 9 may terminate in an outer pad 15.

Circuit patterns 7, 9 may be formed of metal, such as copper. The bond fingers 11 and pads 13, 15 may be plated with one or more various metals, such as gold, silver, palladium, and the like, in order to enhance their further coupling to other structures, such as solder or gold bond wires.

Some or all of the circuit patterns 7 are electrically coupled to respective ones of the circuit patterns 9 through electrically conductive vias 17 that extend vertically through the core layer 5 between the respective circuit patterns 7, 9.

A die pad 19, which typically will be formed of the same material, e.g., copper, as the circuit patterns 7, also is formed on the first surface 5a of core layer 5.

A semiconductor die 21 is mounted on die pad 19. The semiconductor die 21 includes an active surface 21a that includes a plurality of bond pads 23, an opposite inactive surface 21b that faces and is coupled to die pad 19 by an adhesive layer (not shown), such as an epoxy layer or an adhesive tape, and peripheral sidewalls 21c that extend vertically between the active and inactive surfaces 21a, 21b.

Each of the bond pads 23 of semiconductor die 21 is electrically coupled to the bond finger 11 of respective one of the circuit patterns 7 of substrate 3. In this example, the electrical coupling is made by a metal bond wire 25, but equivalent electrical conductors, methods, such as tab bonds or flip chip connections, may be used. Accordingly, the semiconductor die 21 is electrically coupled to some or all of the pads 13 of the circuit patterns 7 through bond pads 23, and bond wires 25.

Semiconductor package 1 includes a plurality of input/output terminals that are provided on the second side surface 3b of substrate 3. The form of the input/output terminals of semiconductor package 1 can vary. In this example, the input/output terminals are solder balls 33, so that semiconductor package 1 is a ball grid array package. Each of the solder balls 33 is fused to the outer surface of one of the pads 15 of the circuit patterns 9 on second side surface 3b of substrate 3. Accordingly, the semiconductor die 21 of semiconductor package 1 is electrically coupled to all or some of the solder balls 33 through the bond pads 23, bond wires 25, circuit patterns 7, vias 17, circuit patterns 9, and pads 15. Some of the solder balls 33 also may be coupled to respective ones of the pads 13 through the pads 15, circuit patterns 7,9 and vias 17, without being electrically coupled to semiconductor die 21.

In an alternative embodiment, the solder balls 33 may be omitted, so that pads 15 serve as the input/output terminals of semiconductor package 1, as in a land grid array package.

The layers of the protective, insulative cover coat 27 overlie all exposed portions of the first and second surfaces 5a, 5b of core layer 5, and portions of the circuit patterns 7, 9. The cover coat 27 may be an epoxy-based solder mask material. The bond fingers 11 and pads 13, 15 are exposed through apertures in the respective layers of cover coat 27.

An enclosure, such as a cap of an insulative plastic encapsulant 29, overlies semiconductor die 21, bond wires 25, inner portions of circuit patterns 7, including bond fingers 11, and an inner region of first side surface 3a of substrate 3. Encapsulant 29 does not, however, cover all of the first side surface 3a of substrate 3. In particular, an outer portion of first side surface 3a, including all of the pads 13 of circuit patterns 7, is outward of the perimeter of encapsulant 29, and hence is not covered by the encapsulant 29.

Encapsulant 29 has the form of a trapezoidal prism, and hence has an upper planar rectangular first surface 29a, an opposite rectangular second surface 29b that is adhered to substrate 3 and is parallel to first surface 29a, and substantially vertical sidewalls 29c that extend between first surface 29a and second surface 29b. Typically, encapsulant 29 is formed by a transfer molding method, but other encapsulation methods may be used. The sidewalls 29c of such a molded encapsulant 29 may have a slight inward taper, as shown.

The placement and shape of encapsulant 29 on substrate 3 may vary. For instance, in the example of FIG. 1b, encapsulant 29 is surrounded by rows and columns of pads 13 on a rectangular first side surface 3a of substrate 3. That is, each of the four sidewalls 29c of encapsulant 29 has two rows of pads 13 adjacent to it. In an alternative embodiment, shown in FIG. 1c, the encapsulant 29 extends to two parallel edges of the rectangular first side surface 3a of substrate 3, while being inward of the other two parallel edges of substrate 3. The parallel sidewalls 29c that are inward of the edges of substrate 3 each have two rows of pads 13 between themselves and the nearest edge of the first side surface 3a. In each case, the pads 13 are have a circular perimeter, but that may vary. Pads 15 also may have a circular perimeter.

A layer of a solder 31 is formed on the outer surface of each of the pads 13 of substrate 3. By "solder" we mean a metal or metallic alloy used when melted to join metallic surfaces. Examples of such metal solders include, for instance, Sn or Au or a bilayer of Au and Ni, and examples of such metallic alloy solders include Pb/Sn, Sn/Au, Sn/Cu/Au, and Sn/Sb, among other possibilities. In the example of FIG. 1a, the solder layers 31 of semiconductor package 1 are formed to have a substantially cylindrical shape, and include a planar first surface 31a, an opposite planar second surface 31b that is fused to the underlying pad 13, and a substantially-straight vertical sidewall 31c.

In one embodiment, the placement and dimensions of the pads 13 and solder layers 31 are controlled to facilitate the stacking of a second semiconductor package onto stackable semiconductor package 1.

Figure 1C:
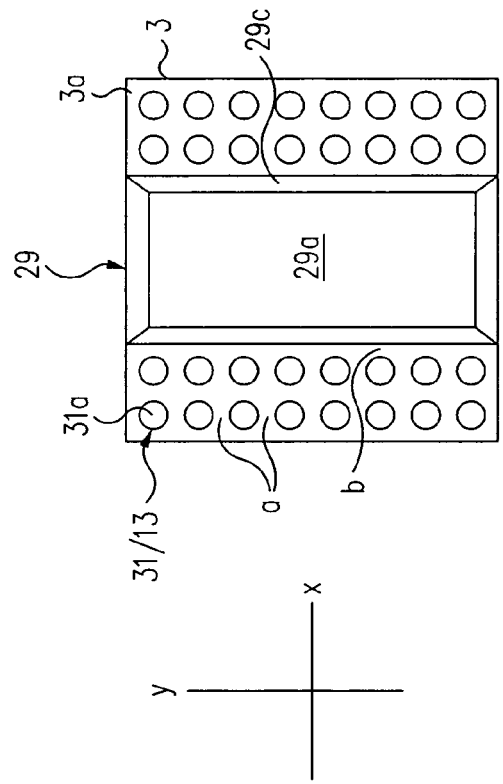
Figure 1B:
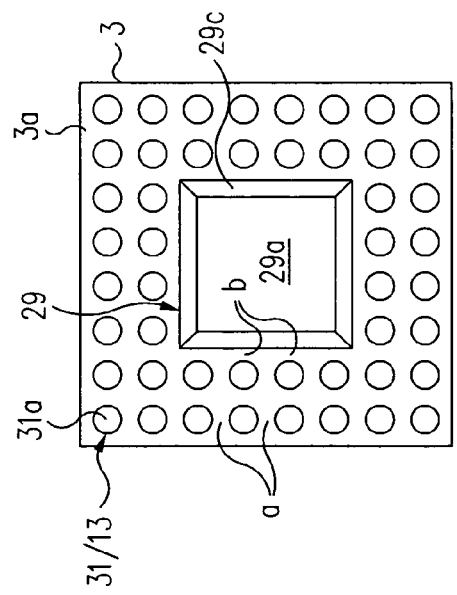

Referring to FIGS. 1a and 1b, the dimension labeled "a" is a lateral distance between a perimeter of each respective pad 13 and the perimeter of each immediately adjacent pad 13. The dimension labeled "b" concerns each of the pads 13 that of the inner row of pads 13 that is immediately adjacent to one of the sidewalls 29c of encapsulant 29, and is a lateral distance between the perimeter of each of those inner pads 13 and the immediately adjacent parallel sidewall 29c of encapsulant 29.

To facilitate package stacking, the lateral distance between the perimeters of immediately adjacent pads 13 should be greater than the lateral distance between the perimeters of the inner pads 13 that are immediately adjacent to one of the sidewalls 29c of encapsulant 29 and the sidewall 29c. That is, dimension "a" should be greater than dimension "b", i.e., a>b.

Referring to FIG. 1a, the dimension labeled "c" is a vertical distance extending from the first side surface 3a of substrate 3 to an uppermost surface of solder layer 31, i.e., the surface of solder layer 31 furthest from first side surface 3a. In the embodiment of FIG. 1a, the uppermost surface of solder layer 31 is the planar first surface 31a. The dimension labeled "d" is a vertical thickness of encapsulant 29 from top to bottom, i.e., the vertical distance from first side surface 3a of substrate 3 to the upper edge of the sidewall 29a, or the vertical distance between first and second surfaces 29a and 29b of encapsulant 29.

To facilitate package stacking, the uppermost surface of the solder layer 31 should have a vertical height relative to first side surface 3a that is greater than a minimum practical limit for forming such solder layers, e.g., 0.05 mm, but is less than the vertical height of sidewall 29c of encapsulant 29. That is, dimension "d" should be greater than dimension "c." As an example, 0.05 mm$\leq$c$\leq$d.

FIGS. 1d, 1e, and 1f illustrate a method of stacking another semiconductor package on the stackable semiconductor package 1 of FIG. 1a. The type of semiconductor packages that can be stacked on semiconductor package 1 may vary. In this example, a conventional ball grid array semiconductor package 100 is stacked on semiconductor package 1 over encapsulant 29 and first surface 5a of substrate 3.

The semiconductor package 100 includes a substrate 103 that includes an insulative core layer 105 having opposed first and second surfaces 105a, 105b. Circuit patterns 107 are provided on first surface 105a. Each of the circuit patterns 107 includes a bond finger 111. Circuit patterns 109 are provided on second surface 105b. Each of the circuit patterns 109 includes a pad 115. Vias 117 extend through core layer 105 and electrically connect respective ones of circuit patterns 107 and 109. A semiconductor die 121 is mounted on a die pad 119 of first side surface 103a of substrate 103, and is covered by a cap of an encapsulant 129. The encapsulant 129 covers the entire first side surface 103a of substrate 103. The bond pads 123 of semiconductor die 121 are each electrically coupled by a respective bond wire 125 to a bond finger 111. Solder balls 133 are fused to the respective pads 115 of the circuit patterns 109 of the second side surface 103b of substrate 103, and serve as the input/output terminals of semiconductor package 100. The solder balls 133 of the semiconductor package 100 are arranged to correspond to the pads 13 of the semiconductor package 1, and accordingly may have an arrangement corresponding to one of FIG. 1b or 1c.

Referring to FIG. 1d, a stack of semiconductor packages 1 and 100 may be made by placing each of the solder balls 133 of the semiconductor package 100 onto the uppermost surface, e.g., first surface 31a, of a respective one of the preformed solder layers 31 of first side surface 3a of substrate 3 of semiconductor package 1. Accordingly, the substrate 103 of semiconductor package 100 is supported over first surface 29a of encapsulant 29 of semiconductor package 1. Subsequently, the solder balls 133 and the solder layers 31 are reflowed at elevated temperatures, and fuse together upon cooling, as shown in FIG. 1f. Accordingly, each of the solder balls 133 of semiconductor package 100 is electrically coupled through the solder layer 31 to the underlying pad 13 of semiconductor package 1. Through these fused connections, the semiconductor dies 21, 121 of the stacked packages 1, 100 may be electrically coupled to each other, and semiconductor die 121 may be electrically coupled to solder balls 33 of semiconductor package 1.

A feature of the semiconductor package 1 is that misalignment of the semiconductor packages 1 and 100 during the stacking process may correct itself during the reflow process. For instance, referring to FIG. 1e, the solder balls 133 of the semiconductor package 100 are not vertically aligned with the corresponding solder layers 31 and pads 13 of semiconductor package 1. Rather, the semiconductor package 100 is laterally skewed.

However, because semiconductor package 1 (see FIG. 1a) has its solder layers 31 and pads 13 sized and located such that a>b and c<d, at least one of the inner rows of solder balls 133 of the misaligned semiconductor package 100 of FIG. 1e comes to rest on and bridges between an inner row of solder layers 31/pads 13 and the immediately adjacent one of the sidewalls 29c of encapsulant 29. In other words, at least one inner row of the solder balls 133 of the top semiconductor package 100 is caught against an adjacent sidewall 29c of encapsulant 29 of the lower semiconductor package 1. As a result, the undesired lateral movement of the semiconductor package 100 during the stacking process is stopped. Moreover, because a>b and c<d, none of the solder balls 133 of the semiconductor package 100 can bridge between (i.e., short circuit) two adjacent ones of the solder layers 31/pads 13 of semiconductor package 1, or fall between adjacent ones of the solder layers 31/pads 13, or contact a wrong one of the solder layers 31/pads 13. Practitioners should appreciate that the dimensions a, b, c, and d of FIG. 1a, and the size of the solder balls 133 are selected so that, in case of a misalignment, the solder balls 133 of the misaligned semiconductor package 100 will catch on the sidewall 29c as shown in FIG. 1e, and will self align during reflow, as shown in FIG. 1f.

During the subsequent reflow step, the misaligned stack 200 of FIG. 1e will be pulled into proper vertical alignment, so as to form the vertically aligned stack 200 of FIG. 1f. Stack 200 includes reflowed solder joints 201 formed from the solder ball 133 and the solder layer 31 of FIGS. 1d, 1e. This realignment is apparently due to the surface tension of the molten solder, but this theory is not a limitation of our invention.

Note that where semiconductor package 1 of FIG. 1a has its encapsulant 29 formed in the manner shown in FIG. 1b, it is possible that two perpendicular inner rows of the solder balls 133 of the upper semiconductor package 100 may be caught against two perpendicular sidewalls 29c of encapsulant 29 of semiconductor package 1. Accordingly, misalignment in two lateral dimensions (x and y) can be stopped and corrected. On the other hand, where encapsulant 29 of semiconductor package is formed in the manner shown in FIG. 1c, only one of the inner rows of solder balls 133 of a skewed semiconductor package 100 will contact a sidewall 29c of the encapsulant 29 of semiconductor package 1. Accordingly, the semiconductor package 1 of FIG. 1c offers less protection against misalignment than the semiconductor package 1 of FIG. 1b.

The solder layer 31 of stackable semiconductor package 1 may have various shapes, and may be formed by several different methods. As mentioned, each of the solder layers 31 of shown in the embodiment of FIG. 1a has a substantially cylindrical shape, and thereby matches the circular perimeter of the underlying pad 13.

FIG. 2 shows an alternative embodiment of stackable semiconductor package 1, where the solder layers 31 each have an uppermost surface 31a with an arced shape, e.g., a semicircular shape.

FIG. 3 shows another alternative embodiment of stackable semiconductor package 1, where the solder layers 31 each have the form of a trapezoidal prism.

FIG. 12 shows another alternative embodiment of stackable semiconductor package 1, which is identical to the embodiment of FIG. 2, except for the further inclusion of an insulative protective layer 35. The protective layer 35 covers the entire first side surface 3a of substrate 3, filling the spaces between the arced solder layers 31 on the pads 13 of substrate 3. The protective layer 35 forms fillets around the arced solder layers 31, protects the substrate 3, and helps to prevent the formation of cracks. The protective layer 35 may be a hardened epoxy-based material. An upper portion of each of arced solder layers 31 is not covered by the protective layer 35, so that the solder balls 133 of a second semiconductor package 100 may be stacked on the arced solder layers 31 to form a package stack 200, as shown in FIGS. 1d-1f.

The alternative semiconductor packages 1 of FIGS. 2, 3, and 12 have the same positional and dimensional relations concerning their respective solder layers 31/pads 13 as was described above for semiconductor package 1 of FIG. 1a, i.e., a>b and c<d. Accordingly, the semiconductor packages 1 of FIGS. 2, 3, and 12 also have the ability to self-correct misalignment in the stacking of a semiconductor package 100 on the semiconductor package 1, as discussed above with respect to FIGS. 1e-1f.

FIG. 4a shows an alternative stackable package 300 that is in several respects identical to semiconductor 1 of FIG. 2, including with regard to the arced solder layers 31 on the pads 13 of the substrate 3. Similar features of semiconductor packages 1 and 300 are given the same reference numbers, and hence the previous discussion applies. Stackable package 300 differs from semiconductor package 1 in three primary respects. First, semiconductor package 300 lacks an encapsulant layer 29. Second, semiconductor package 300 lacks a die pad 19, and has its semiconductor die 21 coupled to the bond fingers 11 of circuit patterns 7 by reflowed solder bumps 301 in a flip chip connection. A layer of an insulative underfill material 303, which may be a hardened epoxy resin material, is coupled between the active surface 21a of semiconductor die 21 and the substrate 3. The underfill material 303 does not extend to or cover the solder layers 31/pads 13 of first side surface 3a of substrate 3. Finally, the semiconductor package 300 lacks solder balls 33 coupled to pads 15 of circuit patterns 9. Rather, semiconductor package 300 is a land grid array package where pads 15 form the input/output terminals of semiconductor package 300.

An alternative embodiment of semiconductor package 300 is provided in FIG. 4b. In this embodiment, solder balls 33 are fused to the pads 15 of the lower circuit patterns 9 of substrate 3, and serve as input/output terminals of the package 300. Further, the underfill layer 303 covers most of the first side surface 3a of the substrate 3, including under the active surface 21a of the semiconductor die 21 and between and around all of the solder layers 31/pads 13 of substrate 3. The solder layers 31 extend vertically outward of the underfill layer 303, so that a second semiconductor package 100 may be stacked onto the semiconductor package 300, similar to the previous discussion of FIG. 1. The underfill layer 303 forms fillets around the solder layers 31, protects the substrate 3, and helps to prevent the formation of cracks.

Figures 4C, 4D:
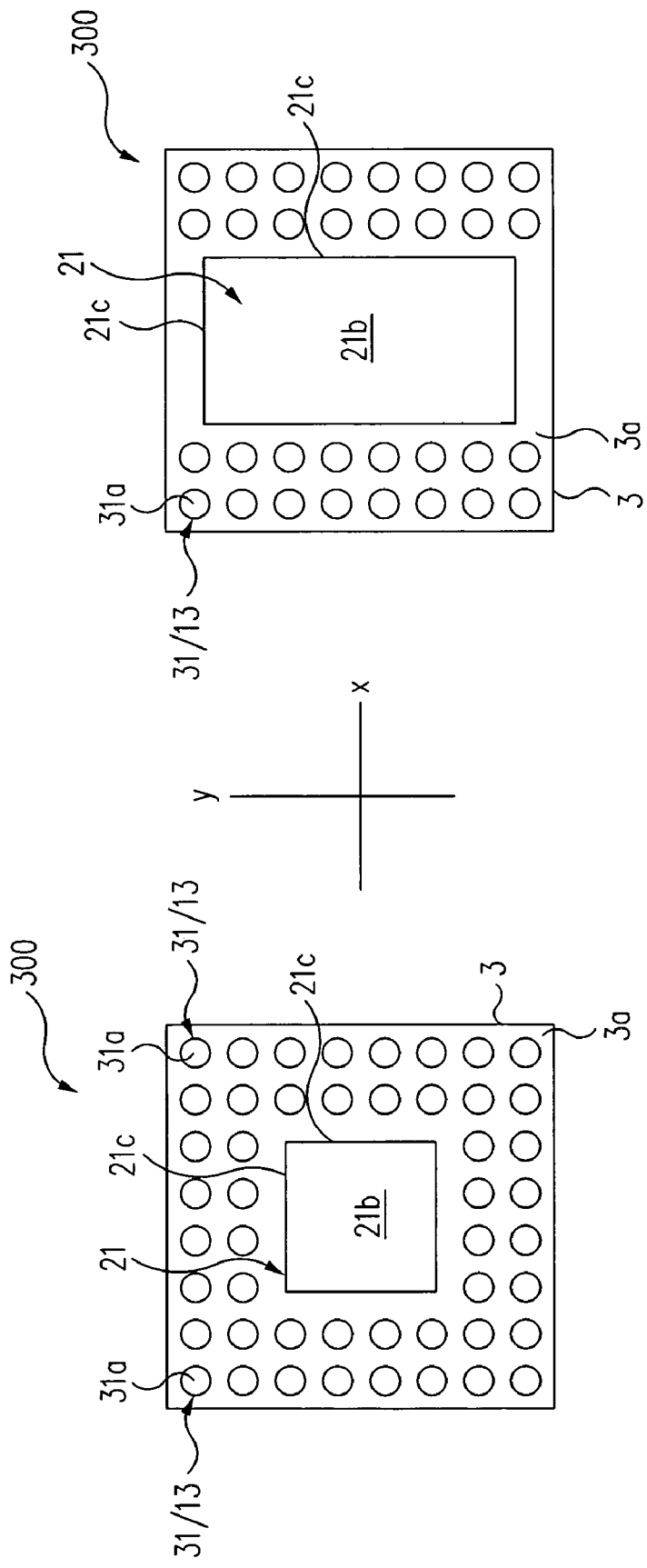
FIGS. 4c and 4d are top plan views of alternative embodiments of the stackable semiconductor packages of FIGS. 4a and 4b, except that the underfill layer is omitted.

FIGS. 4c, 4d provide top plan views of alternative configurations of the semiconductor packages 300 of FIGS. 4a, 4b. (The underfill layer 300 is omitted outward of the semiconductor die 21 for simplicity of the drawing.) These embodiments are the same as those described above for semiconductor package 1 of FIGS. 1b, 1c with respect to the arrangement of the solder layers 31 and pads 13. A difference with respect to FIGS. 1b, 1c is that the semiconductor package 300 lacks encapsulant 29, and accordingly the inactive surface 21b of semiconductor die 21 is visible.

The semiconductor packages 300 of FIGS. 4a, 4b have positional and dimensional relationships concerning their solder layers 31/pads 13 that are the same as those described above for semiconductor package 1 of FIG. 1a with respect to dimensions a and c. Differences include that, because there is no cap of encapsulant 29 (FIG. 1a) over the semiconductor die, the dimension "b'" for semiconductor packages 300 refers to the lateral distance between the perimeter of each of the inner pads 13 of the inner row of pads 13 and the immediately adjacent parallel peripheral sidewall 21c of semiconductor die 21, and the dimension "d'" for semiconductor packages 300 refers to the vertical distance from the first side surface 3a of substrate 3 to the inactive surface 21b of the semiconductor die 21. Hence, the semiconductor packages 300 of FIGS. 4a and 4b, have the dimensional feature that a>b' and c<d'. Accordingly, the semiconductor packages 300 of FIGS. 4a, 4b also have the ability to self-correct misalignment in the stacking of a semiconductor package 100 on the semiconductor package 1, as was discussed above with respect to FIGS. 1d-1f. However, it is the sidewall(s) 21c of semiconductor die 21 that stops the lateral movement of the misaligned second semiconductor package 100, since there is no encapsulant layer 29 in the semiconductor packages 300 of FIGS. 4a, 4b. Practitioners should appreciate that the dimensions a, b', c, and d' of FIGS. 4a, 4b and the size of the solder balls 133 (FIGS. 1d, 1e) are selected so that, in case of a misalignment, the solder balls 133 of the misaligned semiconductor package 100 will catch on the sidewall(s) 21c of the semiconductor die 21, similar to FIG. 1e, and will self align during reflow, similar to FIG. 1f.

FIG. 11 illustrates another embodiment of a stackable semiconductor package. Stackable semiconductor package 50 of FIG. 11 is similar to stackable semiconductor package 1 of FIG. 1a. Similar features of semiconductor packages 1 and 50 are given the same reference numbers, and hence the previous discussion of the features identified by those reference numbers applies and does not need to be repeated.

Stackable semiconductor package 50 of FIG. 11 differs from semiconductor 1 in one respect: namely, instead of having a solder layer 31 on each of the pads 13 of substrate 3, as in semiconductor package 1, semiconductor package 50 has a non-collapsible solder ball 51. Solder ball 51 includes a polymer core 53 that is entirely covered by a layer of solder 55. A feature of the polymer-core solder ball 51 is that it can have a relatively substantial height, and allows for a relatively large standoff of a semiconductor package 100 (FIGS. 1d-1f) that is stacked on the semiconductor package 50.

The stackable package 50 of FIG. 11 has the same positional and dimensional relationships described above concerning the solder layer 31/pads 13 of semiconductor package 1 of FIG. 1b, except that the dimension "c'"" for semiconductor package 50 refers to the vertical distance from the first side surface 3a of substrate 3 to the uppermost surface of the polymer core solder ball 51. Hence, the semiconductor package 50 of FIG. 11 has the dimensional feature that a>b and c"<d. Accordingly, the semiconductor package 50 also has the ability to self-correct misalignment in the stacking of a semiconductor package 100 on the semiconductor package 50, as discussed above with respect to FIGS. 1d-1f.

Figure 5A:
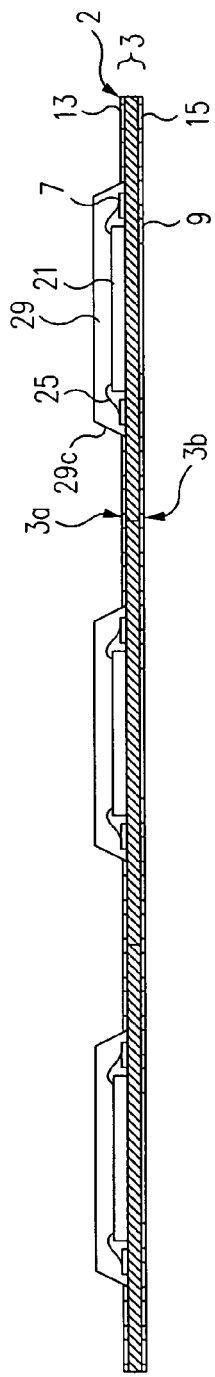
FIGS. 5a-5e are cross-sectional side views of stages in a method of making the stackable semiconductor package of FIG. 2.
Figure 5B:
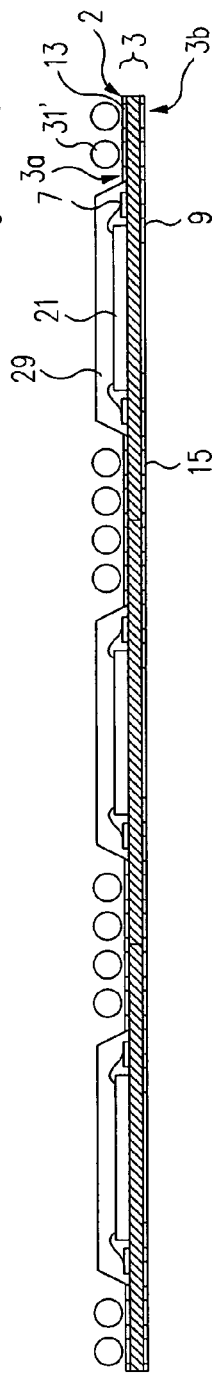
Figure 5C:
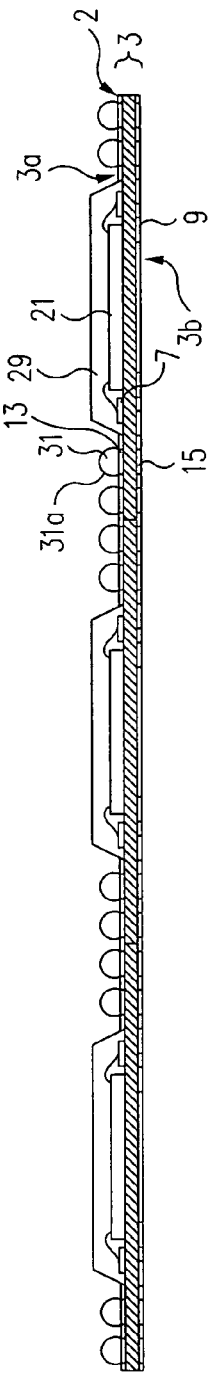
Figure 5D:
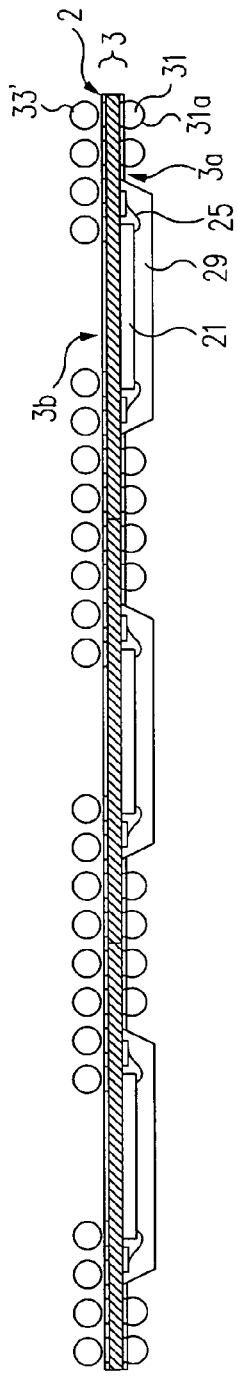
Figure 5E:
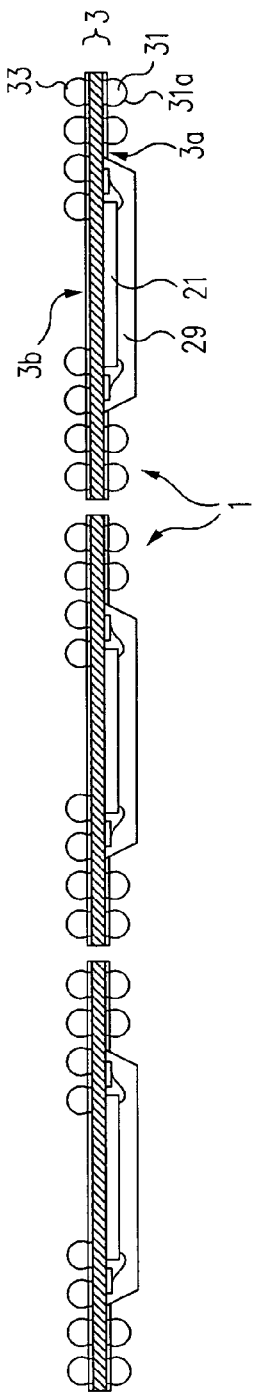

FIGS. 5a-5e are cross-sectional side views of stages in a method of making the stackable semiconductor package 1 of FIG. 2. Referring to FIG. 5a, the method includes providing a substrate sheet 2 that includes an array (a single row or rows and columns) of interconnected substrates 3. At each of the substrates 3, a semiconductor die 21 is coupled to the substrate 3, and then bond wires 25 are electrically coupled between the bond pads of semiconductor die 21 and the bond fingers of the circuit patterns 7 of the first side surface 3 of substrate 3. An individual cap of encapsulant 29 is molded over and onto each of the semiconductor dies 21 and substrates 3, as shown in FIGS. 1a-1c. Referring to FIG. 5b, a dab of flux (not shown) is placed on the upper, outer surface of each of the pads 13, and preformed solder balls 31' are placed onto the flux, thereby temporarily coupling the respective solder balls 31' to the corresponding pads 13. Referring to FIG. 5c, the solder balls 31' are then reflowed, forming an arced solder layer 31 fused to each pad 13, as was described with respect to FIG. 2. Referring to FIG. 5d, flux and preformed solder balls 33' are then placed on each of the pads 15 of the circuit patterns 9 of the second side surface 3b of substrate 3. Referring to FIG. 5e, a reflow step then forms a solder ball 33 fused to each pad 15. Subsequently, the substrate sheet 2 is cut, such as by a sway, to singulate individual stackable semiconductor packages 1, in accordance with FIG. 2.

Figure 6A:
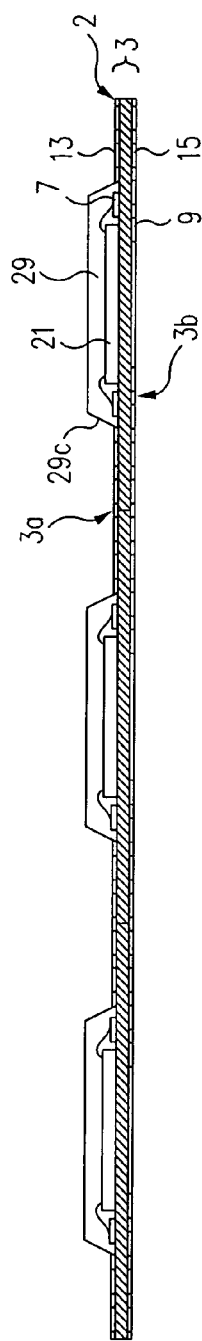
FIGS. 6a-6d are cross-sectional side views of stages in an alternative method of making the stackable semiconductor package of FIG. 2.
Figure 6B:
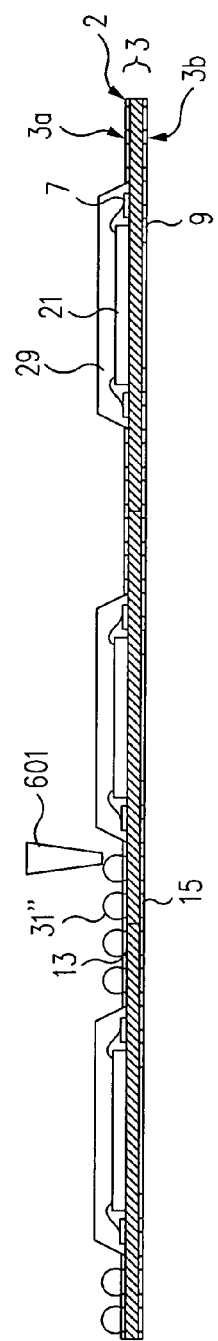
Figure 6C:
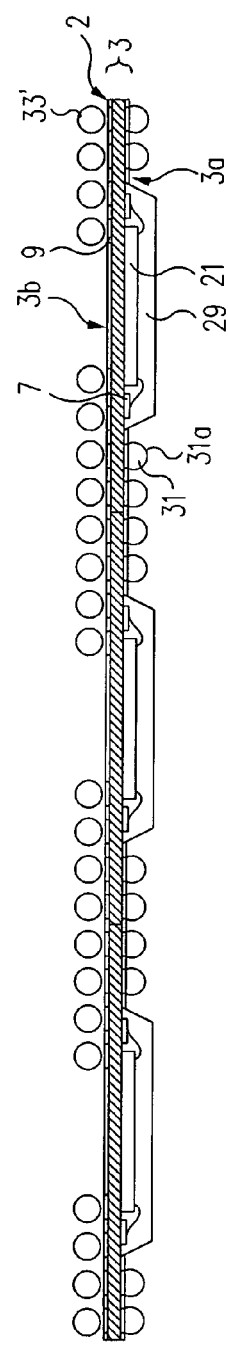
Figure 6D:
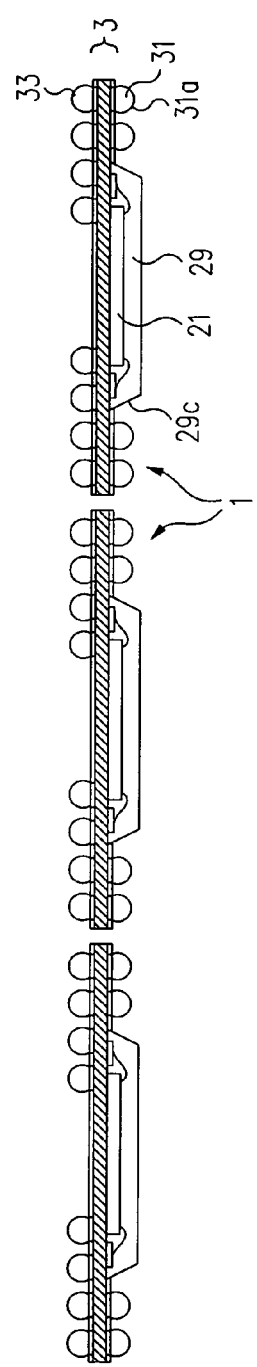

FIGS. 6a-6d are cross-sectional side views of stages in an alternative method of making the stackable semiconductor package of FIG. 2. The steps associated with FIG. 6a are the same as those described above for FIG. 5a, and hence need not be described again. Referring to FIG. 6b, a dab of solder paste 31" is applied onto the upper outer surface of each of the pads 13 using a syringe 601. The solder paste 31" cures to form the arced shaped solder layers 31 of FIG. 2. The steps associated FIGS. 6c and 6d are the same as those described above for FIGS. 5d and 5e, and hence need not be described again.

FIGS. 7a-7e are cross-sectional side views of stages in another method of making the stackable semiconductor package of FIG. 2. The steps associated with FIG. 7a are the same as those described above for FIG. 5a, and hence need not be described again. Referring to FIG. 7b, solder paste 31" is screened through cylindrical holes 703 in a metal mask 701. The holes 703 in the metal mask 701 are each aligned with a respective one of the pads 13 of the respective unsingulated substrates 3. The solder paste 31" on each pad 13 cures into a cylindrical shape. Subsequently, the cylinders of screened-on solder paste 31" are reflowed, so as to form the arced solder layers 31 of FIGS. 2 and 7c. The steps associated FIGS. 7d and 7e are the same as those described above for FIGS. 5d and 5e, and hence need not be described again.

The method of FIGS. 7a-7e can be modified so as to form the stackable semiconductor package 1 of FIG. 1. In particular, the reflow step of FIG. 7c is omitted. The cylinders of solder paste 31" cure into the cylindrical solder layers 31 shown in FIG. 1.

FIGS. 8a-8e are cross-sectional side views of stages in a method of making the semiconductor package 50 of FIG. 11. The steps associated with FIG. 8a are the same as those described above for FIG. 5a, and hence need not be described again. Referring to FIG. 8b, flux and preformed solder balls 33' are placed on the pads 15 of the circuit patterns 9 of the second side surface 3b of each of the interconnected substrates 3 of substrate sheet 2. Referring to FIG. 8c, a reflow step forms a solder ball 33 fused to each pad 15. Subsequently, the substrate sheet 2 is cut, such as by a saw, to singulate partially-formed semiconductor packages 50. Referring to FIG. 8d, the singulated partially-formed semiconductor packages 50 are then placed in an assembly fixture 801, which includes an array of cavities 803. Each of the cavities 803 holds one of the partially-formed semiconductor packages 50. The cavities 803 receive, provide clearance for, the solder balls 33 of the respective partially-formed semiconductor packages 50. Subsequently, a dab of flux and a preformed polymer core solder ball 51' are then placed onto each pad 13 of each of the partially-formed semiconductor packages 50 held in the fixture 801. A reflow step is then performed, which causes the solder layer 55 to fuse to the respective pad 13, thereby forming the polymer core solder balls 51 of FIGS. 8e and 11. The completed semiconductor packages 50 may then be removed from the fixture 801.

The methods of FIGS. 8a-8e can be modified so as to form the stackable semiconductor package 1 of FIG. 3. After singulating the partially formed semiconductor packages 1, similar to FIG. 8c, and inserting the singulated packages in assembly fixture 801, as shown in FIG. 8d, instead of placing the preformed solder balls 51, solder paste 31" is screened through a metal mask onto the pads 13 of the first side surface 3a of each of the substrates 3, as described above with respect to FIG. 7b. Subsequently, heat and pressure are applied to the cylinders of solder paste 31" to form the trapezoidal prism solder layers 31 of FIG. 3. Subsequently, the completed semiconductor packages 1 of FIG. 3 are removed from the assembly fixture 801.

Figure 9A:
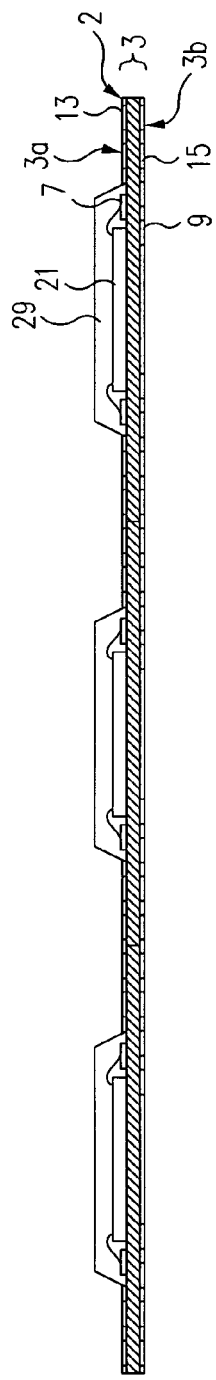
FIGS. 9a-9e are cross-sectional side views of stages in a method of making the stackable semiconductor package of FIG. 12.
Figure 9B:
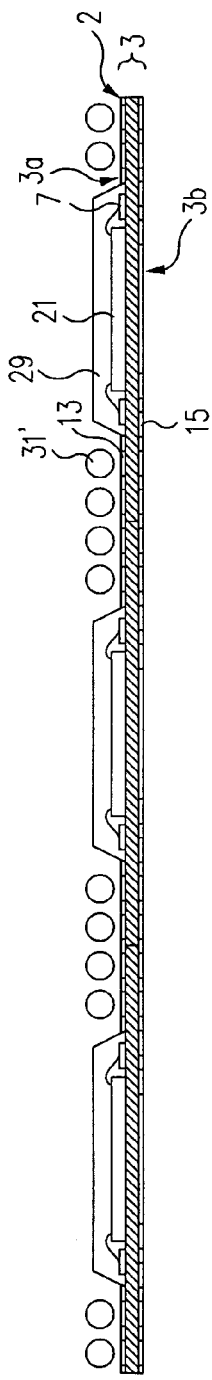
Figure 9C:
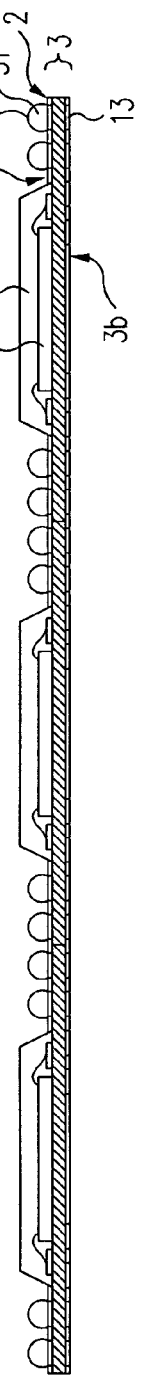
Figure 9D:
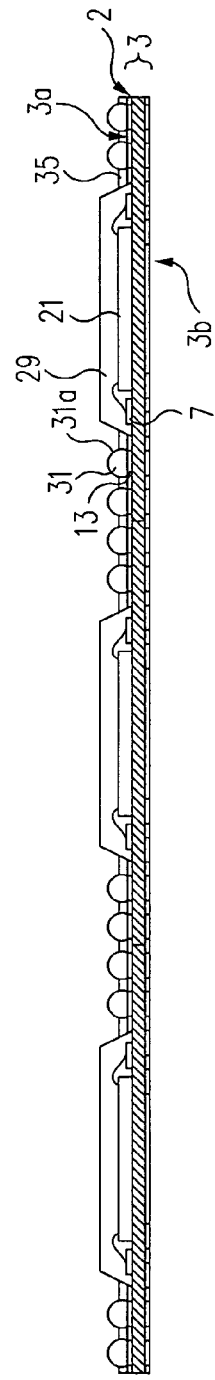
Figure 9E:
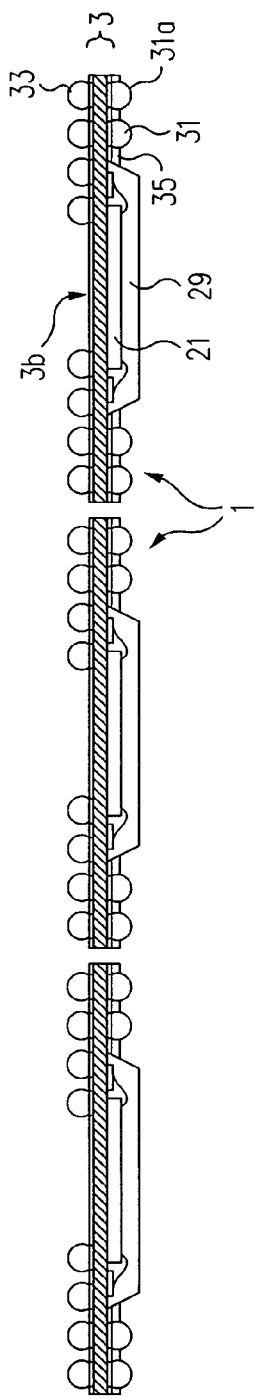

FIGS. 9a-9e are cross-sectional side views of stages in a method of making the semiconductor package 1 of FIG. 12. The steps associated with FIGS. 9a-9c are the same as those described above for FIGS. 5a-5c, and hence need not be described again. Referring to FIG. 9d, the protective layer 35 is applied onto the first side surface 3a of each of the interconnected substrates 3 by dispensing an insulative liquid epoxy-based material through a syringe or the like. Subsequently, the liquid epoxy-based material hardens through a curing process, forming the protective layer 35. Referring to FIG. 9e, solder balls 33 are then fused to the pads 15 of the unsingulated substrates 3, and the semiconductor packages 1 are singulated, as described above with respect to FIGS. 5d and 5e.

FIGS. 10a-10e are cross-sectional side views of stages in a method of making the semiconductor package 300 of FIG. 4b. Referring to FIG. 10a, the method includes providing a substrate sheet 2 that includes an array (a single row or rows and columns) of interconnected substrates 3. At each of the substrates 3, a semiconductor die 21 is coupled to the substrate 3 in a flip chip connection. In particular, the active surface 21a of the semiconductor die 21 is arranged so as to face first side surface 3a of the substrate 3, and solder bumps that have been pre-formed on either the bond pads 23 or the bond fingers 11 of circuit patterns 7, or both, are reflowed, so as to form the solder bumps 301 that electrically couple semiconductor die 21 to the circuit patterns 7. Subsequently, as shown in FIGS. 10b and 10c, a dab of flux and a preformed solder ball 31' are placed on each pad 13 of each substrate 3, and are then reflowed, so as to form the arced solder layers 31 of FIG. 4b. Referring to FIG. 10d, a liquid insulative epoxy-based underfill material is then dispensed onto the first side surface 3a of each substrate 3 of substrate sheet 2. The liquid underfill material is disposed between the active surface 21a of the semiconductor die 21 and the first side surface 3a of each substrate 3, and between and around the arced solder layers 31 of each substrate, without covering the upper portions of the solder layers 31. Subsequently, the liquid underfill material is cured, so as to form a hardened layer of underfill 303. Referring to FIG. 10e, solder balls 33 are then fused to the pads 15 of the unsingulated substrates 3 of the substrate sheet 2, and the semiconductor packages 300 are singulated by cutting through the substrate sheet 2 and the underfill 303 using a saw or the like.

The method of FIGS. 10a-10e may be modified to form the semiconductor package 300 of FIG. 4a by applying the underfill material 303 only on an inner portion of the first side surface 3a of the substrate 3 under the semiconductor die 21, and by omitting the solder balls 33.

Practitioners will appreciate that the above-described embodiments can be varied to accommodate different types of semiconductor packages and applications. For instance, the stackable semiconductor package 1 of FIG. 1b has its semiconductor die 21 coupled to the first side surface 3a of substrate 3. Alternatively, the substrate 3 may have a central aperture that extends between the first and second side surfaces 3a, 3b. The semiconductor die 21 may be disposed within the central aperture, and may be supported therein by the encapsulant 29. A further variation of the stackable semiconductor package 1 of FIG. 1b may have a second semiconductor die enclosed within the encapsulant 29 with the semiconductor die 21. For instance, the second semiconductor die may be stacked on the active surface 21a of the semiconductor 21 in a manner that does not interfere with the bond pads 23 or bond wires 25. For instance, an adhesive or silicon spacer with opposed tape layers may be coupled between the stacked dies to provide clearance for the bond wires of the lower die. Alternatively, the encapsulant 29 of FIGS. 1a, 2, 3, 11 and 12 may be replaced with another type of enclosure for the semiconductor die 21, such as a hollow cap, which may be formed of metal or glass.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

The invention claimed is:

1. A method of forming a stack of semiconductor packages comprising:
  coupling a semiconductor die to a substrate, the substrate comprising a first side surface including metal first circuit patterns, and a second side surface opposite the first side surface and including metal second circuit patterns, wherein each of the first circuit patterns includes a respective one of a plurality of first pads, the first pads are aligned in a plurality of rows, each of the first pads is a lateral distance "a" from immediately adjacent ones of the first pads, and at least some of the first circuit patterns are electrically coupled through the substrate to at least some of the second circuit patterns;
  covering the semiconductor die and a portion of the first side surface of the substrate with an encapsulant, wherein the encapsulant has substantially vertical sidewalls extending a vertical distance "d" from the first side surface of the substrate, all of the first pads are external to the encapsulant, and each of the first pads that is immediately adjacent to one of the sidewalls of the encapsulant is a lateral distance "b" from the respective sidewall; and
  forming a plurality of layers of a solder on the first pads, wherein each of the layers of the solder has an exposed exterior surface portion that faces in a same direction as the first side surface of the substrate and extends a maximum vertical distance "c" from the first side surface of the substrate, and
  wherein a>b and c<d.

2. The method of forming a stack of semiconductor packages of claim 1, wherein each of the layers of the solder is substantially cylindrical.

3. The method of forming a stack of semiconductor packages of claim 1, wherein the exposed exterior surface portion of each of the layers of the solder is arced.

4. The method of forming a stack of semiconductor packages of claim 1, wherein each of the layers of the solder has the form of a trapezoidal prism.

5. The method of forming a stack of semiconductor packages of claim 1, wherein each of the layers of the solder has a polymer core.

6. The method of forming a stack of semiconductor packages of claim 1, wherein the encapsulant has four of the sidewalls that are arranged so that the encapsulant has a substantially rectangular lateral perimeter, and at least two of the sidewalls are parallel to and immediately adjacent to respective ones of the rows of the first pads.

7. The method of forming a stack of semiconductor packages of claim 6, wherein each of the four sidewalls of the encapsulant is parallel to and immediately adjacent to a respective one of the rows of the first pads.

8. The method of forming a stack of semiconductor packages of claim 1, further comprising forming a layer of a hardened insulative material covering the first side surface of the substrate between and around the first pads, wherein the layer of the hardened insulative material covers a portion of each of the layers of solder, but the exposed exterior surface of each of the layers of solder is outward of the layer of the hardened insulative material.

9. The method of forming a stack of semiconductor packages of claim 1 wherein the semiconductor die is coupled to the substrate in a flip chip connection.

10. The method of forming a stack of semiconductor packages of claim 9 further comprising coupling an underfill material between an active surface of the semiconductor die and the substrate.

11. The method of forming a stack of semiconductor packages of claim 1 wherein each of the second circuit patterns includes a respective one of a plurality of second pads, the method further comprising forming a plurality of layers of a solder on the second pads.

12. The method of forming a stack of semiconductor packages of claim 1 wherein the substrate is one of a plurality of substrates of a substrate sheet, the method further comprising singulating the substrate sheet.

13. The method of forming a stack of semiconductor packages of claim 1, wherein
  the substrate is one of a plurality of substrates of a substrate sheet, the method further comprising:
  coupling bond wires between bond pads of the semiconductor die and bond fingers of the first circuit patterns;
  coupling first solder balls to the first pads of the first circuit patterns;
  reflowing the first solder balls to form the layers of the solder;

coupling second solder balls to second pads of the second circuit patterns;

fusing the second solder balls to the second pads of the second circuit patterns; and singulating the substrate sheet to form a stackable semiconductor package.

14. The method of forming a stack of semiconductor packages of claim 13 further comprising:

placing a second semiconductor package on the stackable semiconductor package, wherein the second semiconductor package is laterally skewed.

15. The method of forming a stack of semiconductor packages of claim 14 wherein solder balls of the second semiconductor package are misaligned with the layers of the solder of the stackable semiconductor package.

16. The method of forming a stack of semiconductor packages of claim 15 wherein an inner row of the solder balls of the second semiconductor package rests between an inner row of the layers of the solder and one of the sidewalls of the encapsulant.

17. The method of forming a stack of semiconductor packages of claim 15 wherein an inner row of the solder balls of the second semiconductor package is caught against one of the sidewalls of the encapsulant.

18. The method of forming a stack of semiconductor packages of claim 15 further comprising reflowing the solder balls of the second semiconductor package, wherein the second semiconductor package is pulled into alignment with the stackable semiconductor package during the reflowing the solder balls of the second semiconductor package.

19. The method of forming a stack of semiconductor packages of claim 18 wherein the reflowing the solder balls of the second semiconductor package forms solder joints from the layers of the solder layers and the solder balls of the second semiconductor package.

20. A method of forming a stack of semiconductor packages comprising:

coupling a semiconductor die to a first side surface of a substrate, the first side surface comprising metal first circuit patterns, wherein each of the first circuit patterns includes a respective one of a plurality of first pads, and the first pads are aligned into at least two parallel rows;

covering the semiconductor die and a portion of the first side surface of the substrate with an enclosure without covering any of the first pads, wherein the enclosure has opposed parallel substantially vertical first and second sidewalls, wherein each of the first and second sidewalls is immediately adjacent to and parallel to a respective one of the rows of the first pads;

forming a plurality of layers of a solder on the first pads, wherein each of the layers of the solder has an exposed exterior surface portion that faces in a same direction as the first side surface of the substrate, and wherein a lateral distance "a" between immediately adjacent ones of the first pads, a lateral distance "b" between each of the first and second sidewalls and the first pads of the row immediately adjacent to the respective sidewall, a vertical distance "c" between the first side surface and an uppermost portion of the exterior surface portion of each of the layers of the solder, and a vertical distance "d" between the first side surface and an uppermost edge of each of the first and second sidewalls of the enclosure are selected so that a>b and c<d.

* * * * *

UNITED STATES PATENT AND TRADEMARK OFFICE
CERTIFICATE OF CORRECTION

PATENT NO. : 7,459,349 B1  Page 1 of 1
APPLICATION NO. : 11/254339
DATED : December 2, 2008
INVENTOR(S) : Akito Yoshida and Young Wook Heo It is certified that error appears in the above-identified patent and that said Letters Patent is hereby corrected as shown below:

In Column 14, Line 2, Claim 19, after "layers of the solder", delete "layers".

Signed and Sealed this

Third Day of March, 2009

JOHN DOLL
*Acting Director of the United States Patent and Trademark Office*